(12) United States Patent
Staals et al.

(10) Patent No.: US 8,975,599 B2
(45) Date of Patent: Mar. 10, 2015

(54) IMAGE SENSOR, LITHOGRAPHIC APPARATUS COMPRISING AN IMAGE SENSOR AND USE OF AN IMAGE SENSOR IN A LITHOGRAPHIC APPARATUS

(75) Inventors: Frank Staals, Eindhoven (NL); Joeri Lof, Eindhoven (NL); Erik Roelof Loopstra, Heeze (NL); Wim Tjibbo Tel, Helmond (NL); Bearrach Moest, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1978 days.

(21) Appl. No.: 11/797,505

(22) Filed: May 3, 2007

(65) Prior Publication Data

US 2008/0273183 A1  Nov. 6, 2008

(51) Int. Cl.
| | |
|---|---|
| G01J 1/04 | (2006.01) |
| G21K 5/10 | (2006.01) |
| G03F 7/20 | (2006.01) |
| G03F 9/00 | (2006.01) |

(52) U.S. Cl.
CPC .......... *G03F 7/7085* (2013.01); *G03F 7/70483* (2013.01); *G03F 7/70341* (2013.01); *G03F 9/7088* (2013.01)
USPC ................... 250/491.1; 250/492.22

(58) Field of Classification Search
CPC ..... G03F 1/42; G03F 7/7085; G03F 7/70666; G03F 1/36; G03F 9/7088; G03F 9/7046; G03F 9/7062
USPC ................ 250/492.1, 492.2, 372, 216, 491.1; 355/53, 55, 67–68; 356/399–401
See application file for complete search history.

(56) References Cited

U.S. PATENT DOCUMENTS

| | | | |
|---|---|---|---|
| 4,454,422 A | 6/1984 | Persyk | |
| 5,674,650 A * | 10/1997 | Dirksen et al. | 430/22 |
| 5,821,532 A * | 10/1998 | Beaman et al. | 250/239 |
| 5,841,520 A * | 11/1998 | Taniguchi | 355/53 |
| 6,057,538 A * | 5/2000 | Clarke | 250/208.1 |
| 6,125,092 A | 9/2000 | Takei et al. | |
| 6,175,417 B1 | 1/2001 | Do et al. | |
| 6,184,517 B1 | 2/2001 | Sawada et al. | |

(Continued)

FOREIGN PATENT DOCUMENTS

| | | |
|---|---|---|
| EP | 1 369 743 A2 | 12/2003 |
| JP | 07-037958 A | 2/1995 |

(Continued)

OTHER PUBLICATIONS

International Search Report for Application No. PCT/NL2008/050264 mailed Nov. 24, 2008, 8 pgs.

(Continued)

*Primary Examiner* — Brooke Purinton
(74) *Attorney, Agent, or Firm* — Sterne, Kessler, Goldstein & Fox P.L.L.C

(57) ABSTRACT

The invention relates to an image sensor for detection of an aerial image formed by a beam of radiation in a lithographic projection apparatus for exposing a pattern onto a substrate held in a substrate plane by a substrate holder. The image sensor has an image detector and a lens. The lens is arranged to project at least part of the aerial image onto the image detector. The image sensor is positioned such within the substrate holder that the lens is positioned proximate the substrate plane.

29 Claims, 4 Drawing Sheets

(56) References Cited

U.S. PATENT DOCUMENTS

| | | | |
|---|---|---|---|
| 6,538,721 B2* | 3/2003 | Okita et al. ............... 355/53 |
| 6,545,746 B1 | 4/2003 | Nishi |
| 6,628,390 B1 | 9/2003 | Johnson |
| 6,842,247 B1* | 1/2005 | Wehrens et al. ........... 356/400 |
| 6,906,305 B2 | 6/2005 | Pease et al. |
| 7,005,627 B2* | 2/2006 | Lim ........................ 250/208.1 |
| 7,019,312 B2* | 3/2006 | Kruit ....................... 250/492.2 |
| 7,019,846 B2 | 3/2006 | Emer et al. |
| 7,045,755 B2* | 5/2006 | Tsai et al. ................. 250/208.1 |
| 7,053,355 B2 | 5/2006 | Ye et al. |
| 7,196,322 B1* | 3/2007 | Hsin et al. ................ 250/239 |
| 7,230,252 B2 | 6/2007 | Muraki et al. |
| 7,453,078 B2* | 11/2008 | Kok et al. ................. 250/548 |
| 7,511,261 B2* | 3/2009 | Hsin et al. ................ 250/239 |
| 7,566,854 B2* | 7/2009 | Yang et al. ............... 250/208.1 |
| 7,643,976 B2 | 1/2010 | Shin et al. |
| 7,749,666 B2 | 7/2010 | Gassner et al. |
| 8,027,813 B2 | 9/2011 | Slonaker |
| 8,039,807 B2 | 10/2011 | Tanitsu |
| 8,054,447 B2 | 11/2011 | Nagasaka et al. |
| 2001/0026367 A1 | 10/2001 | Magome |
| 2002/0001088 A1 | 1/2002 | Wegmann et al. |
| 2002/0057345 A1 | 5/2002 | Tamaki et al. |
| 2002/0062206 A1 | 5/2002 | Liebchen |
| 2002/0066863 A1 | 6/2002 | Chao et al. |
| 2002/0076629 A1 | 6/2002 | Miwa et al. |
| 2002/0187406 A1 | 12/2002 | Magome et al. |
| 2003/0090681 A1 | 5/2003 | Jones |
| 2003/0128870 A1 | 7/2003 | Pease et al. |
| 2003/0156276 A1 | 8/2003 | Bowes |
| 2003/0215965 A1* | 11/2003 | Grodnensky et al. ........... 438/16 |
| 2004/0013956 A1 | 1/2004 | Sogard |
| 2004/0036940 A1 | 2/2004 | Hazelton et al. |
| 2004/0051055 A1 | 3/2004 | Kruit |
| 2004/0053148 A1 | 3/2004 | Morohoshi |
| 2004/0137677 A1 | 7/2004 | Lowisch et al. |
| 2004/0159787 A1* | 8/2004 | Nakasuji et al. ............. 250/311 |
| 2004/0211922 A1* | 10/2004 | Kroon et al. ............... 250/492.2 |
| 2005/0010878 A1 | 1/2005 | Blatchford et al. |
| 2005/0040321 A1* | 2/2005 | Wakisaka et al. ............ 250/216 |
| 2005/0078287 A1* | 4/2005 | Sengers et al. .............. 355/30 |
| 2005/0109916 A1* | 5/2005 | Parks ........................ 250/208.1 |
| 2005/0143962 A1 | 6/2005 | Keane et al. |
| 2005/0146693 A1 | 7/2005 | Ohsaki |
| 2005/0206879 A1 | 9/2005 | Van Dijk et al. |
| 2005/0280800 A1* | 12/2005 | Laiding et al. ............... 355/77 |
| 2006/0055704 A1 | 3/2006 | Kruk et al. |
| 2006/0055904 A1* | 3/2006 | Baselmans .................. 355/55 |
| 2006/0060781 A1* | 3/2006 | Watanabe et al. ........... 250/310 |
| 2006/0061746 A1 | 3/2006 | Kok et al. |
| 2006/0126046 A1 | 6/2006 | Hansen |
| 2006/0139610 A1 | 6/2006 | Bruls et al. |
| 2006/0139611 A1 | 6/2006 | Wagner et al. |
| 2006/0192129 A1* | 8/2006 | Yun et al. ................. 250/370.11 |
| 2006/0219947 A1 | 10/2006 | Van De Kerkhof et al. |
| 2006/0256322 A1 | 11/2006 | Bowes |
| 2006/0290907 A1 | 12/2006 | Yoo |
| 2007/0050749 A1 | 3/2007 | Ye et al. |
| 2007/0070511 A1 | 3/2007 | Lee et al. |
| 2007/0105029 A1* | 5/2007 | Ausschnitt .................. 430/30 |
| 2007/0115457 A1 | 5/2007 | Matsuzawa et al. |
| 2007/0152178 A1 | 7/2007 | Bastiaensen et al. |
| 2007/0201013 A1 | 8/2007 | Venema |
| 2007/0213967 A1 | 9/2007 | Park et al. |
| 2007/0260419 A1* | 11/2007 | Hagiwara .................. 702/150 |
| 2008/0042068 A1 | 2/2008 | Nishinaga et al. |
| 2008/0067446 A1 | 3/2008 | Belic et al. |
| 2008/0152234 A1 | 6/2008 | Feldman |
| 2008/0204690 A1 | 8/2008 | Berger et al. |
| 2009/0201478 A1* | 8/2009 | Clauss et al. ................ 355/67 |
| 2009/0226846 A1 | 9/2009 | Nakano et al. |
| 2010/0053388 A1 | 3/2010 | Kobayashi et al. |
| 2010/0053394 A1 | 3/2010 | Kinoshita |
| 2010/0195071 A1 | 8/2010 | Staals et al. |

FOREIGN PATENT DOCUMENTS

| | | |
|---|---|---|
| JP | 10-300671 A | 11/1998 |
| JP | 2005-129914 A | 5/2005 |
| JP | 2005-268744 A | 9/2005 |
| JP | 2005-268759 A | 9/2005 |
| JP | 2005-322856 A | 11/2005 |
| JP | 2007-235132 A | 9/2007 |
| WO | 2006/106833 A1 | 10/2006 |

OTHER PUBLICATIONS

International Preliminary Report on Patentability and Written Opinion of the Written Searching Authority directed to related International Patent Application No. PCT/NL2008/050264, issued Nov. 3, 2009; 10 pages.

English-Language Translation of Notification of Reason(s) for Refusal directed to related Japanese Patent Application No. 2010-506104, mailed Aug. 9, 2011, from the Japanese Patent Office; 3 pages.

English-Language Translation of Notification of Reason(s) for Refusal directed to related Japanese Patent Application No. 2010-506104, mailed Dec. 20, 2011, from the Japanese Patent Office; 2 pages.

English-Language Translation of Notification of Reason(s) for Refusal directed to related Korean Patent Application No. 10-2009-7025102, mailed Jan. 2, 2012, from the Korean Intellectual Property Office; 6 pages.

Non-Final Rejection mailed Dec. 3, 2012 for U.S. Appl. No. 12/598,377, filed Mar. 30, 2010; 10 pages.

Final Rejection mailed Apr. 24, 2013 for U.S. Appl. No. 12/598,377, filed Mar. 30, 2010; 12 pages.

Non-Final Rejection mailed Oct. 11, 2013 for U.S. Appl. No. 12/598,377, filed Mar. 30, 2010; 11 pages.

Final Rejection mailed Apr. 22, 2014 for U.S. Appl. No. 12/598,377, filed Mar. 30, 2010; 13 pages.

* cited by examiner

IMAGE SENSOR, LITHOGRAPHIC APPARATUS COMPRISING AN IMAGE SENSOR AND USE OF AN IMAGE SENSOR IN A LITHOGRAPHIC APPARATUS

FIELD

The present invention relates to an image sensor, a lithographic apparatus comprising an image sensor, patterning device for use in such a lithographic apparatus, use of an image sensor in a lithographic apparatus and computer program product enabling such a use.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In device manufacturing methods using lithographic apparatus, an important factor in the yield, i.e. the percentage of correctly manufactured devices, is the accuracy within which layers are printed in relation to layers that have previously been formed. This is known as overlay and the overlay error budget will often be 10 nm or less. To achieve such accuracy, the substrate must be aligned to the mask pattern to be transferred with great accuracy.

A number of sensors is used at substrate level for evaluating and optimizing imaging performance. These may include transmission image sensors (TIS). A TIS is a sensor that is used to measure at substrate level the position of a projected aerial image of a mark pattern at mask (reticle) level. The projected image at substrate level may be a line pattern with a line width comparable to the wavelength of the exposure radiation. The TIS measures aforementioned mark pattern using a transmission pattern with a photocell underneath it. The sensor data may be used to measure the position of the mask with respect to the substrate table in six degrees of freedom, i.e. three degrees of freedom related to translation and three degrees of freedom related to rotation. Moreover, magnification and scaling of the projected mark pattern may be measured. With a small line width, the sensor is capable of measuring the pattern positions and influences of several illumination settings, e.g. annular, dipole, for several mask types (binary mask, phase-shift mask). The TIS may also be used to measure optical performance of a tool, like a lithographic projection apparatus. By using different illumination settings in combination with different projected images, properties such as pupil shape, coma, spherical aberration, astigmatism and field curvature can be measured.

With the continual desire to image ever smaller patterns to create device with higher component densities, there is pressure to reduce overlay errors, which leads to a desire for improved sensors. Moreover, aforementioned ever smaller patterns require more often than before critical device structures in the mask pattern which substantially differ from the mark pattern used. The critical device structures follow a different transmission path than the mark pattern, and, as a result, encounters different aberrations along its transmission path. Deformations formed as a result of the different transmission path may lead to overlay and focus errors.

SUMMARY

It is desirable to provide a sensor at substrate level with high sensitivity that can be used in high NA systems, i.e. immersion lithographic apparatus, and capable of measuring critical structures.

To that end, the invention provides an image sensor for detection of an aerial image formed by a beam of radiation in a lithographic projection apparatus for exposing a pattern onto a substrate held in a substrate plane by a substrate holder, the image sensor comprising
    an image detector; and
    a lens arranged to project at least part of the aerial image onto the image detector; wherein the image sensor is positioned such within the substrate holder that the lens is positioned proximate the substrate plane.

Additionally, in an embodiment, the invention provides a method for transmission image detection of an aerial image formed in a lithographic projection apparatus by radiation of a predetermined wavelength comprising:
    providing a structure provided with an object mark;
    providing such an image sensor;
    providing a projection system between the structure and the detector
    forming an object mark pattern upon illumination of the object mark by the radiation with a predetermined wavelength;
    forming an object mark aerial image of the object mark by the projection system at an image side of the projection system;
    detecting the aerial image with the image sensor.

Additionally, in an embodiment, the invention provides a lithographic apparatus comprising such an image sensor, the sensor being substantially positioned in the substrate plane.

Additionally, in an embodiment, the invention provides a device manufacturing method comprising projecting a patterned beam of radiation onto a substrate using such a lithographic apparatus.

Additionally, in an embodiment, the invention provides a patterning device for use in such a lithographic apparatus, the patterning device being provided with a proximity curve mark.

Additionally, in an embodiment, the invention provides a patterning device for use in such a lithographic apparatus, the patterning device being provided with a critical dimension product feature.

Additionally, in an embodiment, the invention provides a use of such a lithographic apparatus to align the patterning device supported by the support structure with respect to the substrate holder.

Additionally, in an embodiment, the invention provides a computer program product comprising computer executable code, which, when loaded on a computer assembly, enables the computer assembly to control such a use.

Additionally, in an embodiment, the invention provides a use of such a lithographic apparatus, the lithographic apparatus further being provided with such a patterning device, to determine a proximity curve characteristic for the lithographic apparatus.

Additionally, in an embodiment, the invention provides a computer program product comprising computer executable code, which, when loaded on a computer assembly, enables the computer assembly to control such a use.

Additionally, in an embodiment, the invention provides a use of such a lithographic apparatus, the lithographic apparatus further being provided with a such a patterning device, to determine optimal illumination conditions of the lithographic apparatus.

Additionally, in an embodiment, the invention provides a computer program product comprising computer executable code, which, when loaded on a computer assembly, enables the computer assembly to control such a use.

Additionally, in an embodiment, the invention provides a use of such a lithographic apparatus to verify optical proximity correction.

Additionally, in an embodiment, the invention provides a computer program product comprising computer executable code, which, when loaded on a computer assembly, enables the computer assembly to control such a use.

Additionally, in an embodiment, the invention provides a use of such a lithographic apparatus to determine an interrelationship between aberrations of the projection system and the aerial image of the pattern.

Finally, in an embodiment, the invention provides a computer program product comprising computer executable code, which when loaded on a computer assembly, enables the computer assembly to control such a use.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
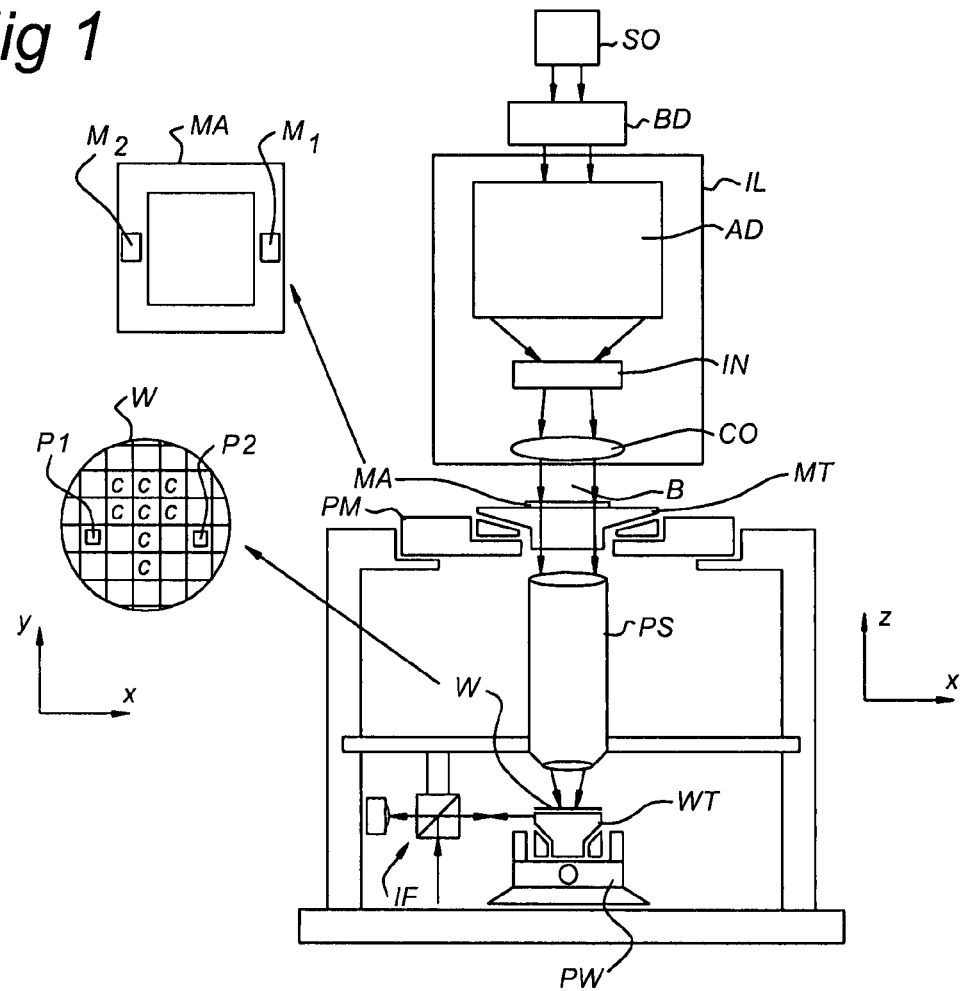
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV-radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
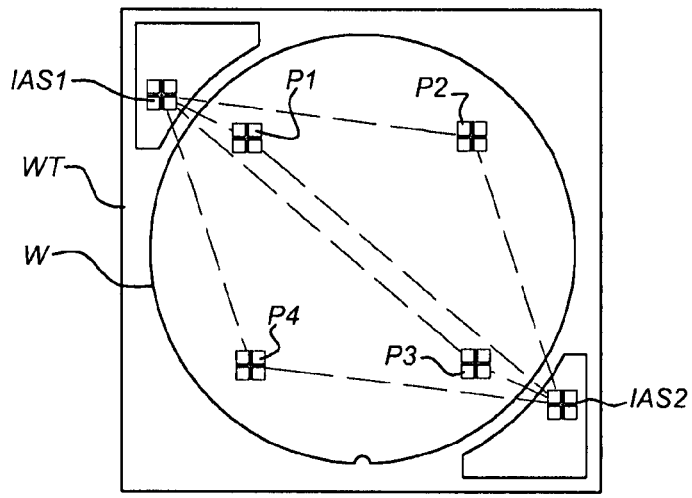
FIG. 2 schematically depicts an arrangement of the substrate table depicted in the lithographic apparatus of FIG. 1 provided with image sensors according to an embodiment of the invention.

FIG. 2 schematically depicts an arrangement of the substrate table WT depicted in the lithographic apparatus of FIG. 1, in which the substrate table WT is provided with an embodiment of the image sensor according to the invention. In the substrate table WT, two image sensors IAS1 and IAS2 are provided. The image sensors can be used to determine a location of an aerial image of a pattern, e.g. an object mark, on the mask MA by scanning the image sensor IAS1 or IAS2 through the aerial image.

By means of the image sensors IAS1 and IAS2, when their position in the substrate table is well-known, the relative position of the aerial image of the pattern on the mask MA with respect to the substrate table WT can be determined. The substrate table WT may be provided with a substrate W comprising substrate marks, e.g. substrate marks P1, P2, P3, P4 as depicted in FIG. 2. An alignment sensor (not shown) may previously obtain relative positions of the substrate marks P1, P2, P3, P4. The knowledge of the relative positions of the substrate marks P1, P2, P3, P4 obtained by the alignment sensor combined with the relative position of the image of the object mark on the mask MA with respect to the wafer table WT deduced from information obtained with the image sensors IAS1, IAS2, allow the substrate W to be positioned at any desired position relative to the projected image of the mask MA with great accuracy. It must be understood that instead of two image sensors IAS1 and IAS2, more or less image sensors may be present, e.g. one or three.

Figure 3:
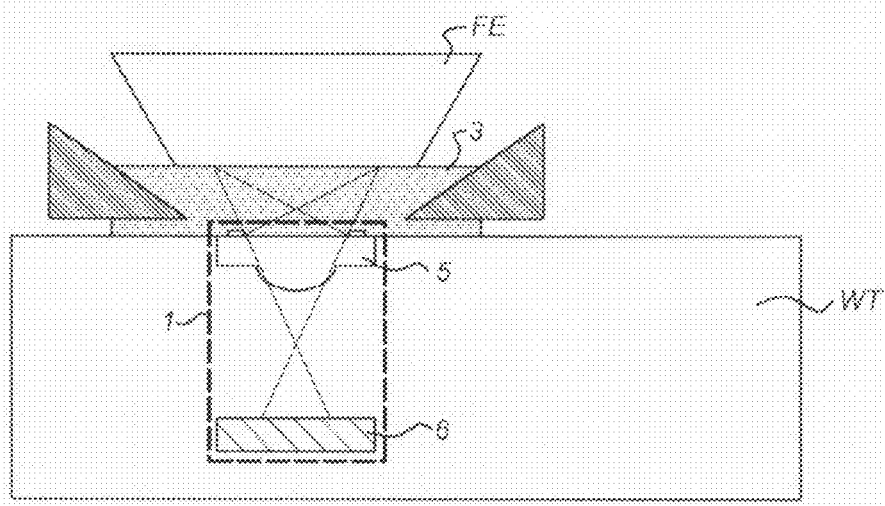
FIG. 3 schematically depicts a cross-section of part of a lithographic apparatus comprising an embodiment of an image sensor according to the present invention.

FIG. 3 schematically depicts a cross-section of part of a lithographic apparatus comprising an embodiment of an Image sensor according to the present invention. The cross-section shows a final element FE of the projection system PL positioned on top of an image sensor 1 embedded in the substrate table WT.

The embodiment of the image sensor 1 depicted in FIG. 3 is positioned in an immersion lithographic apparatus. In the immersion arrangement shown in FIG. 3, a reservoir 3 forms a contactless seal to the wafer table WT provided with the image sensor 1 around an image field of the projection system PL so that liquid is confined to fill a space between the surface of the substrate table WT provided with the image sensor 1 and the final element FE of the projection system PL.

The image sensor 1 comprises a lens 5 and an image detector 6. The lens 5 is arranged to project at least part of an aerial image of a pattern, schematically depicted by the dotted lines, projected on the lens 5 by means of the final element FE of the projection system PL, on the image detector 6. The image detector 6 comprises a detecting surface. The detecting surface may be constructed in a matrix form, such that the detecting surface is composed of a plurality of pixels. The image detector 6 may be a CCD-camera or a CMOS-camera. The lens 5 may be a microscope lens. The lens 5 may have a magnification between 1500 and 2500.

Figure 4:
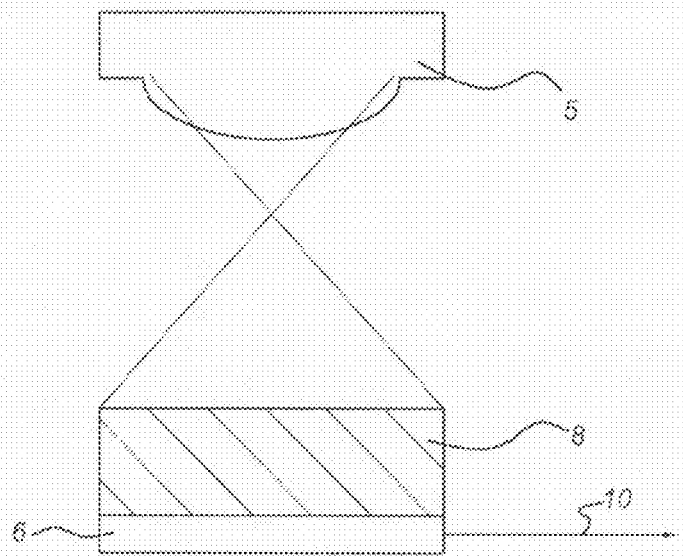
FIG. 4 schematically depicts an embodiment of an image sensor according to the present invention.

FIG. 4 schematically depicts an embodiment of an image sensor 1 according to the present invention. In this embodiment, the image sensor, next to the lens 5 and image detector 6, further comprises an amplification device 8 which is positioned between the lens 5 and the image detector 6. In an embodiment, the amplification device is a multichannel plate.

The amplification device 8 may be mounted on the detector, e.g. in a way shown in FIG. 4, or, alternatively, be positioned in close proximity thereof. In yet another embodiment, the amplification device 8 is integrated in the image detector 6, e.g. a plurality of avalanche diodes is arranged such that each avalanche diode of the plurality of avalanche diodes corresponds with a single pixel of the image detector 6.

Figure 7:
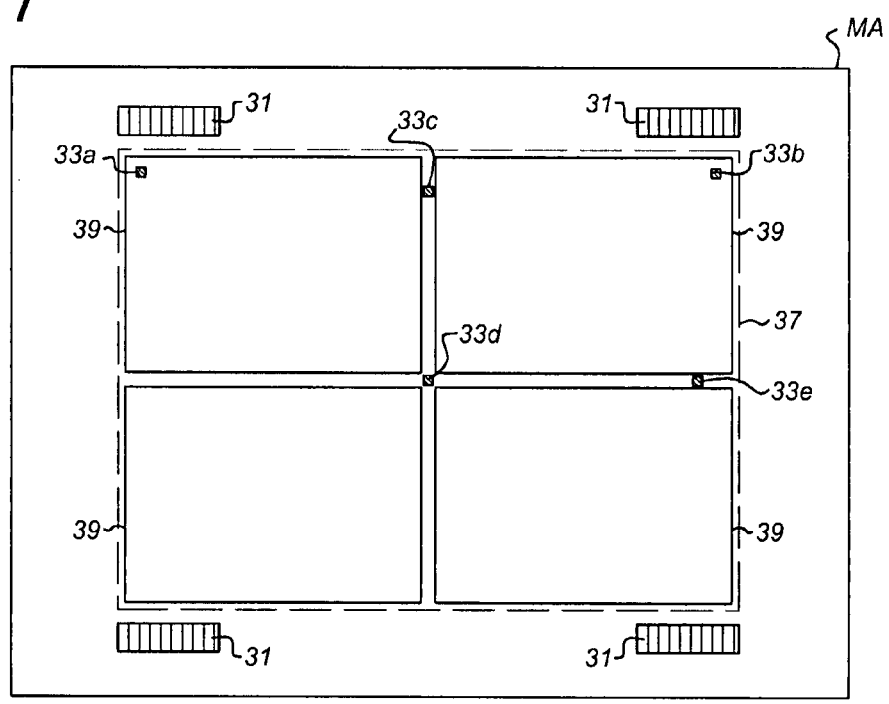
FIG. 7 schematically depicts a mask provided with marks which may be imaged by embodiments of an image sensor according to the present invention.

The amplification device 8 is arranged for amplifying the incoming light intensity. As a result, more light falls on the detection surface of the image detector 6, which may improve its imaging performance. The image, schematically depicted by the dotted lines, that is detected by means of the image detector 6 may be transferred in form of an information signal 10 towards a processor, e.g. a processor used in a computer assembly as shown in FIG. 7.

Figure 5:
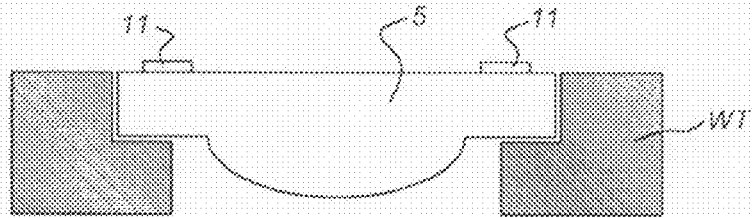
FIG. 5 schematically depicts an embodiment of a lens used in an embodiment of an image sensor according to the present invention.

FIG. 5 schematically depicts the lens 5 in an embodiment of the image sensor according to the present invention in more detail. The lens 5 is integrated in the substrate table WT. At its top surface, i.e. the surface facing the incoming light which in a lithographic apparatus corresponds with the surface facing the final element FE of the projection system PL, the lens 5 is provided with at least one lens reference mark 11. By means of the at least one lens reference mark 11 on the top surface of the lens 5, the position of the lens 5 with respect to the substrate table WT may be determined.

Figure 6:
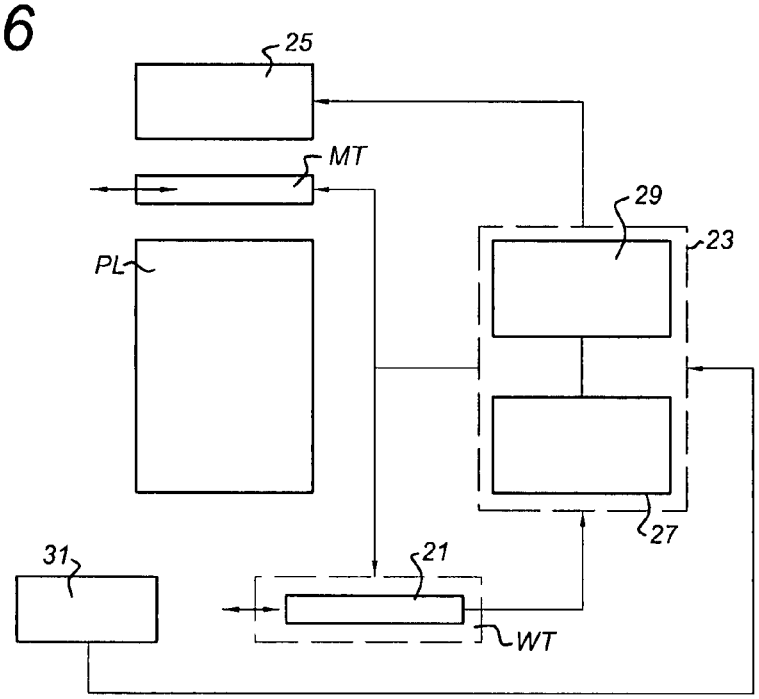
FIG. 6 schematically depicts an arrangement for use of embodiments of an image sensor according to the present invention.

FIG. 6 schematically depicts an arrangement for use of embodiments of an image sensor 21 according to the present invention. At the left, several elements of a lithographic apparatus are shown, i.e. a mask MA and a projection system PL. The mask MA is configured to impart an incoming beam of radiation with a pattern in its cross-section. The projection system PL is configured to expose the patterned beam on a substrate (not shown). In case a measurement is taken with an embodiment of the image sensor 21, the projection system PL instead exposes the patterned beam on the image sensor 21. The arrangement further comprises a control unit 23 and a parameter adjustment device 25. The control unit 23 is operationally coupled to the image sensor 21 and the parameter adjustment device 25, and may also be operationally coupled to other elements of a lithographic apparatus, e.g. substrate table WT and mask table MT.

The image sensor 21 is arranged to transfer image data to the control unit 23. The control unit 23 in its turn, is arranged for receiving the image data from the image sensor 21. In response, the control unit 23 may control a parameter of the lithographic apparatus, e.g. by changing settings of the parameter adjustment device 25, altering a position of the substrate table WT or altering a position of the mask MA or mask table MT.

The control unit 23 may comprise a processor 27 and a memory 29. Further details with respect to arrangements of a control unit are explained with reference to FIG. 8.

The arrangement as depicted in FIG. 6 may be used for several purposes. In the following paragraphs several uses are described. The description of the uses is intended to be illustrative, not limiting. Thus, it will be apparent to one skilled in the art that different uses of the arrangement remain possible without departing from the scope of invention.

Use to Align Substrate Table with Respect to Mask (Table)

An embodiment of the arrangement may be used in a similar way as the transmission image sensor TIS that is used in state-of-the-art lithographic machines, i.e. to determine and correct the position of the substrate table WT and the substrate W residing thereon with respect to the mask table MT or, alternatively, to mask MA. However, as schematically depicted in FIG. 7, instead of a specially designed object mark 31 residing on the mask MA as depicted in FIG. 7, or, alternatively, on the mask table MT, which specially designed object mark 31 typically has a size of 64×40 microns at substrate level, a mark 33 may be used of a much smaller size, e.g. 1×1 microns at substrate level. The mark 33 comprises critical patterns, i.e. patterns with a shape and dimension typical for the pattern to be exposed on the substrate W.

Aberrations in the projection system PL may be entirely different for features of different sizes, and may also differ spatially, i.e. the aberration is different for light passing the projection system PL at a first location as compared to light passing the projection system PL at a second location. As the features of the marks 33 are of the same dimensions as the pattern to be exposed, the observed aberrations give a better impression of the aberrations that will be encountered by the mask pattern during exposure.

Moreover, as the marks 33 that can be used by embodiments of the image sensor 1, 21 do not occupy a lot of space, i.e. a few squared microns at substrate level at the most, the marks 33 may be present within the exposure area of the mask MA, schematically depicted as dotted square 37 in FIG. 7. On the other hand, the specially designed object mark 31 that is suitable for a conventional TIS-sensor would be positioned at an edge of the mask MA, i.e. outside the exposure area. As can be seen in FIG. 7, within an exposure area 37, several dies, denoted by the squares 39, may be present. Each die 39 may be provided with a different pattern. The marks 33 may be present within a die 39, e.g. marks 33*a* and 33*b*. Additionally or alternatively, the marks 33 may be present between the dies 39, e.g. marks 33*c*, 33*d* and 33*e*.

Finally, aforementioned possibility opens the possibility to use a small pattern of the actual product feature(s) to be exposed. The sensor can be used without the use of a dedicated mark.

An image of the mark 33 suitable for embodiments of the image sensor according to the invention follows an optical path through the projection system PL which is more similar to the optical path that is followed by the pattern on the mask MA to be exposed on the substrate W. Consequently, a position of the substrate table WT, and the substrate W lying thereon with respect to the mask table MT or, alternatively, mask MA may be optimized to an extent beyond present-day capabilities.

Note that it may be possible to use an embodiment of an image sensor according to the present invention besides a conventional image sensor, e.g. the aforementioned TIS-sensor. For example, in FIG. 2, IAS1 may be a conventional image sensor, e.g. the aforementioned TIS-sensor, and IAS2 an image sensor in accordance with an embodiment of the present invention.

Use to Measure Proximity Curve and Optimize Illumination Settings in Response

The image sensor 21 in the arrangement may be used to measure a proximity curve, i.e. a curve qualifying the influence of neighboring features on the imaging of a certain feature. In a proximity curve, the change in printed resist critical dimension is measured for a certain type of structure, e.g. lines with a specific diameter like 130 nm, on a certain type of mask, e.g. a binary mask, with varying pitches, e.g. ranging from 1:1, i.e. space between lines is equal to line width, to isolated lines in a certain number of steps, e.g. ten. Such a range may be provided in the form of a proximity curve mark.

A proximity curve is generally machine-dependent. Information regarding the proximity curve measured by the image sensor 21, e.g. by measuring on a proximity curve mark, may be compared by the control unit 23 with proximity curves from other machines, e.g. by using the processor 27 in the control unit 23 to compare the measurement results with proximity curves of other machines stored as reference data in memory 29 of control unit 23. Additionally, or alternatively, the measured proximity curve may serve as an input for the processor 27 of the control unit 23 to determine in what way and to what extent parameters should be changed to obtain optimal exposure results. In response to reception of the proximity curve, the processor 27 of the control unit 23, optionally by using information stored in memory 29 of control unit 23, calculates adjustment data to adjust at least one parameter in the lithographic apparatus, e.g. the illumination settings.

The adjustment data are transferred towards the parameter adjustment device 25. In an embodiment, the parameter adjustment device 25 comprises an array, e.g. more than 1000, reflective elements, the reflective elements being arranged in a grid-like formation and individually controllable with respect to their orientation. In an embodiment, the parameter adjustment device 25 is an illumination settings adjustment device. Possible adjustments related to illumination settings include adjustments leading to a change of the numerical aperture NA of the projection system PL and adjustments of the angular distribution of light falling on the mask, also referred to as σ. In illumination settings for angular illumination, the angular distribution of the outer light cone, i.e. $\sigma_{out}$, and the inner cone $\sigma_{in}$ may be altered separately.

In an embodiment it is possible to measure aforementioned proximity curve on-line. Consequently, the illumination settings may be adjusted on a substrate-to-substrate basis to obtain so called substrate-to-substrate proximity control.

Use to Measure critical CD on Product Features and Optimize Source Conditions in Response Instead of a proximity curve, critical dimensions (CD) on product features which are critical for a certain product development may be measured by image sensor 21. The processor 27 of the control unit 23, optionally in collaboration with a memory like memory 29 of the control unit 29, may calculate parameter adjustment data, upon reception of the measurement results on the critical CD on product features. In this case, a parameter to be adjusted may again be an illumination setting including adjustments related to changes in NA or adjustments related to changes of σ. The parameter adjustment device 25 may again comprise an array of reflective elements, and may again be an illumination adjustment device positioned in close proximity of the mask MA or mask table MT between the source (not shown) and the mask MA or mask table MT, as described earlier.

Alternatively or additionally, adjustments may relate to changing the type of illumination by adjustment of the source that is used, e.g. from a dipolar illumination setting towards an annular illumination setting or from a first annular illumination setting towards a second annular illumination setting. In these cases, the parameter adjustment device 25 is a source adjustment device. The source adjustment device may directly adapt parameters with respect to the source. Also in this case, the parameter adjustment device 25, in an embodiment, may comprise an array of reflective elements as described earlier.

Adjustments are not limited to changes of the type of illumination. The type of illumination may remain the same while a property of that type of illumination is adjusted. For example, the illumination may be stretched in a particular direction, may be made larger, made smaller, etc.

In an embodiment it is possible to measure critical dimensions on-line. Consequently, the illumination settings may be adjusted on a substrate-to-substrate basis to obtain substrate-to-substrate illumination setting optimization.

Use to Perform On-Line Optical Proximity Correction (OPC) Verification

The image sensor 21 may be used to verify whether additional structures provided in the pattern of a mask MA for the purpose of OPC, i.e. to control the shapes of desired pattern structures, are positioned at the right location in the pattern. The position of the additional structures may be determined and the processor 27 of the control unit 23 may use the determined position to calculate, optionally by using reference data stored in memory 29 of the control unit 23, the effect of the additional structure on the main structure after exposure and development in resist. If the position is wrong, and the additional structure provides an undesired change of the shape of the desired main pattern structure, the mask may be replaced or improved before real exposure on resist takes place.

Use to Investigate Relation Aerial Image and Aberration Fingerprint

Currently, models are used to simulate what changes occur in an aerial image as a result of a change in aberrations of the projection system PL. With an arrangement as shown in FIG. 6, an investigation of the relation between the aerial image and the aberration fingerprint of the projection system PL may be performed. For this purpose, a wavefront aberration sensor 31 is added. The wavefront aberration sensor 31, e.g. an interferometric wavefront measurement system like a so-called Integrated Lens Interferometer At Scanner (ILIAS), may be used to measure the aberration fingerprint of the projection system PL on the surface of the substrate that is placed on the substrate table WT. Simultaneously, an aerial image may be observed by means of the image sensor 21. The wavefront aberration sensor 31 is configured to transfer information with respect to the aberration fingerprint towards the control unit 23. The processor 27 of the control unit 23 is configured to compare the aberration fingerprint information originating from the wavefront aberration sensor 31 with the image data obtained from the image sensor 21. Upon comparison, several trends may be derived, optionally by using data stored in memory 29 of the control unit 23. As a result, one can for example monitor structurally dependent offsets of aberrations.

Figure 8:
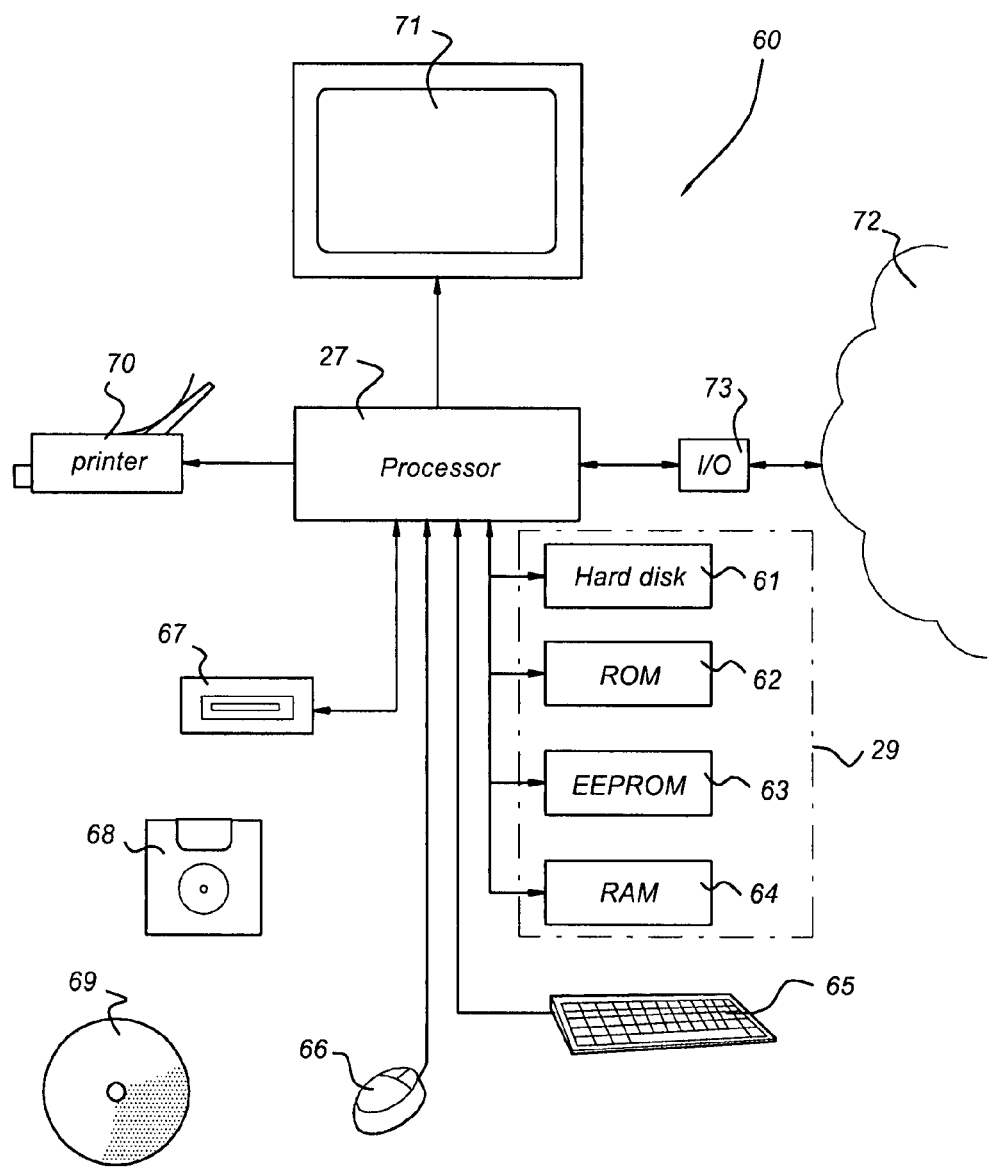
FIG. 8 schematically depicts an embodiment of a computer assembly that may be used by an arrangement for use of embodiments of an image sensor according to the present invention.

It should be understood that the control unit 23 may be a computer assembly 60 as shown in FIG. 8. The computer assembly 60 may be a dedicated computer in the form of a control unit in embodiments of the assembly according to the invention or, alternatively, be a central computer controlling the lithographic projection apparatus. The computer assembly 60 may be arranged for loading a computer program product comprising computer executable code. This may enable the computer assembly 60, when the computer program product is downloaded, to control aforementioned uses of a lithographic apparatus with embodiments of the image sensor.

The memory 29 connected to processor 27 may comprise a number of memory components like a hard disk 31, Read Only Memory (ROM) 62, Electrically Erasable Programmable Read Only Memory (EEPROM) 63 en Random Access Memory (RAM) 64. Not all aforementioned memory components need to be present. Furthermore, it is not essential that aforementioned memory components are physically in close proximity to the processor 27 or to each other. They may be located at a distance away The processor 27 may also be connected to some kind of user interface, for instance a keyboard 65 or a mouse 66. A touch screen, track ball, speech converter or other interfaces that are known to persons skilled in the art may also be used.

The processor 27 may be connected to a reading unit 67, which is arranged to read data, e.g. in the form of computer executable code, from and under some circumstances store data on a data carrier, like a floppy disc 68 or a CDROM 69. Also DVD's or other data carriers known to persons skilled in the art may be used.

The processor 27 may also be connected to a printer 70 to print out output data on paper as well as to a display 71, for instance a monitor or LCD (Liquid Crystal Display), of any other type of display known to a person skilled in the art.

The processor 27 may be connected to a communications network 72, for instance a public switched telephone network (PSTN), a local area network (LAN), a wide area network (WAN) etc. by means of transmitters/receivers 73 responsible for input/output (I/O). The processor 27 may be arranged to communicate with other communication systems via the communications network 72. In an embodiment of the invention external computers (not shown), for instance personal computers of operators, can log into the processor 27 via the communications network 72.

The processor 27 may be implemented as an independent system or as a number of processing units that operate in parallel, wherein each processing unit is arranged to execute sub-tasks of a larger program. The processing units may also be divided in one or more main processing units with several subprocessing units. Some processing units of the processor 27 may even be located a distance away of the other processing units and communicate via communications network 72.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" and "target portion", respectively. The substrate referred to herein may be processed before or after exposure, in for example a track (a tool that typically applies a layer of resist to a substrate and develops the exposed resist), a metrology tool and/or an inspection tool where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus for exposing a pattern onto a substrate held in a substrate plane by a substrate holder, comprising:
   an image sensor comprising:
   an image detector; and
   a lens arranged to project at least part of an aerial image of an alignment mark onto said image detector; wherein said image sensor is positioned within said substrate holder such that said lens is positioned proximate said substrate plane; and
   a patterning device comprising the pattern, wherein the pattern includes the alignment mark that is of comparable dimensions to critical dimension features of the pattern.

2. The lithographic projection apparatus according to claim 1, wherein said image detector is a CCD-camera or a CMOS-camera.

3. The lithographic projection apparatus according to claim 1, wherein said lens is a microscope lens.

4. The lithographic projection apparatus according to claim 3, wherein said microscope lens has a magnification between 1500 and 2500.

5. The lithographic projection apparatus according to claim 1, wherein said image sensor further includes an amplification device positioned between said lens and said image detector.

6. The lithographic projection apparatus according to claim 5, wherein said amplification device is a multichannel plate.

7. The lithographic projection apparatus according to claim 1, wherein said lens comprises reference marks for determining a position of said image sensor with respect to said substrate table.

8. The lithographic projection apparatus according to claim 1, wherein said lens has a numerical aperture larger than 1.2.

9. A lithographic apparatus comprising:
 an illumination system configured to provide a beam of radiation;
 a support structure configured to support a patterning device that serves to impart said beam of radiation with a pattern in its cross-section;
 a substrate holder configured to hold a substrate in a substrate plane;
 a projection system configured to expose said patterned beam on said substrate; and
 an image sensor comprising:
  an image detector; and
  a lens arranged to project at least part of an aerial image of an alignment mark onto said image detector;
 wherein said image sensor is positioned within said substrate holder such that said lens is positioned proximate said substrate plane, and
 wherein the pattern includes the alignment mark that is of comparable dimensions to critical dimension features of the pattern.

10. The lithographic apparatus according to claim 9, wherein said image sensor is arranged for generating image data and said lithographic apparatus further comprises:
 a control unit operationally coupled to said image sensor and arranged for receiving said image data from said image sensor, said control unit comprising a processor for calculating adjustment data; and
 a parameter adjustment device operationally coupled to said control unit and arranged for controlling at least one parameter of said lithographic apparatus in response to reception of said adjustment data from said control unit.

11. The lithographic apparatus according to claim 10, wherein said control unit further comprises a memory, said memory arranged for storing reference data and being accessible for said processor.

12. The lithographic apparatus according to claim 10, wherein said parameter adjustment device is an illumination setting adjustment device arranged for adjusting illumination settings of said beam of radiation.

13. The lithographic apparatus according to claim 12, wherein said at least one parameter is related to illumination settings of said beam of radiation and selected from a group consisting of numerical aperture of the projection system, angular distribution of said beam of radiation, and type of illumination provided by a source arranged for generating radiation for use in said beam of radiation.

14. The lithographic apparatus according to claim 10, wherein said lithographic apparatus further comprises a wavefront aberration sensor enabling simultaneous measurement of wavefront aberrations of the projection system by means of said wavefront aberration sensor and measurement of an aerial image of the pattern by means of said image sensor.

15. A method for transmission image detection of an aerial image formed in a lithographic projection apparatus by radiation of a predetermined wavelength comprising:
 providing a structure with an object mark having comparable dimensions to critical dimension features of a circuit pattern;
 providing an image sensor;
 providing a projection system between said structure and said image sensor;
 forming an object mark pattern upon illumination of said object mark by said radiation with a predetermined wavelength;
 forming an object mark aerial image of said object mark by said projection system at an image side of said projection system; and
 detecting said aerial image with said image sensor,
 wherein said image sensor comprises:
  an image detector; and
  a lens arranged to project at least part of the aerial image onto an image detector.

16. The lithographic apparatus according to claim 10, wherein said alignment mark includes a critical dimension product feature that is located between dies.

17. The lithographic apparatus according to claim 10, wherein said patterning device includes a proximity curve mark.

18. The lithographic apparatus according to claim 10, wherein said alignment mark includes a critical dimension product feature.

19. The lithographic apparatus according to claim 18, wherein said critical dimension product feature is located in a die area.

20. A method, comprising:
 providing a beam of radiation by an illumination system of a lithographic apparatus;
 patterning the beam of radiation by a pattern in a patterning device supported by a support structure of the lithographic apparatus;
 holding a substrate in a substrate plane by a substrate holder of the lithographic apparatus;
 exposing the patterned beam of radiation on the substrate using a projection system of the lithographic apparatus; and
 aligning using an image sensor, wherein the image sensor comprises:
  an image detector; and
  a lens arranged to project at least part of the aerial image onto said image detector;
 wherein said image sensor is positioned within said substrate holder that said lens is positioned proximate said substrate plane, and
 wherein the pattern device includes an alignment mark that is of comparable dimensions to critical dimension features of the pattern, said patterning device supported by said support structure with respect to said substrate holder.

21. A tangible computer-readable medium having stored thereon, computer-executable instructions that, when executed by a machine, cause the machine to perform a method according to claim 20.

22. The method of claim 20, further comprising:
 calculating adjustment data by a control unit based on image data received from the image sensor, wherein the control unit comprises a processor;

controlling, by a parameter adjustment device, at least one parameter of the lithographic apparatus based on received adjustment data from the control unit; and determining a proximity curve characteristic for said lithographic apparatus, wherein the patterning device further includes a proximity curve mark.

23. A tangible computer-readable medium having stored thereon, computer-executable instructions that, when executed by a machine, cause the machine to perform a method according to claim 22.

24. The method of claim 20, further comprising:

calculating adjustment data by a control unit based on image data received from the image sensor, wherein the control unit comprises a processor;

controlling, by a parameter adjustment device, at least one parameter of the lithographic apparatus based on received adjustment data from the control unit; and determining optimal illumination conditions of said lithographic apparatus, wherein the alignment mark includes a product feature having a critical dimension.

25. A tangible computer-readable medium having stored thereon, computer-executable instructions that, when executed by a machine, cause the machine to perform a method according to claim 24.

26. Calculating adjustment data by a control unit based on image data received from the image sensor, wherein the control unit comprises a processor;

controlling, by a parameter adjustment device, at least one parameter of the lithographic apparatus based on received adjustment data from the control unit; and verifying optical proximity correction using the control unit, wherein said control unit further comprises a memory, said memory arranged for storing reference data and being accessible for said processor.

27. A tangible computer-readable medium having stored thereon, computer-executable instructions that, when executed by a machine, cause the machine to perform a method according to claim 26.

28. The method of claim 20, further comprising:

calculating adjustment data by a control unit based on image data received from the image sensor, wherein the control unit comprises a processor;

controlling, by a parameter adjustment device, at least one parameter of the lithographic apparatus based on received adjustment data from the control unit; and determining an interrelationship between aberrations of the projection system and an aerial image of the pattern by simultaneously measuring wavefront aberrations of the projection system using a wavefront aberration sensor and measuring the aerial image of the pattern using the image sensor.

29. A tangible computer-readable medium having stored thereon, computer-executable instructions that, when executed by a machine, cause the machine to perforin a method according to claim 28.

\* \* \* \* \*

UNITED STATES PATENT AND TRADEMARK OFFICE
CERTIFICATE OF CORRECTION

PATENT NO. : 8,975,599 B2  
APPLICATION NO. : 11/797505  
DATED : March 10, 2015  
INVENTOR(S) : Staals et al.

Page 1 of 1

It is certified that error appears in the above-identified patent and that said Letters Patent is hereby corrected as shown below:

In the claims

In column 16, line 26, claim 29, please delete "perforin" and insert --perform--.

Signed and Sealed this
Seventeenth Day of November, 2015

Michelle K. Lee
*Director of the United States Patent and Trademark Office*